(12) United States Patent
Wang et al.

(10) Patent No.: US 7,269,016 B2
(45) Date of Patent: Sep. 11, 2007

(54) HEAT DISSIPATING DEVICE

(75) Inventors: Jin-Liang Wang, Shenzhen (CN);
Gen-Cai Wang, Shenzhen (CN);
Wei-Guo Zhou, Shenzhen (CN)

(73) Assignees: Fu Zhun Precision Industry (Shenzhen) Co., Ltd., Bao'an District, Shenzhen City, Guangdong Province (CN); Foxconn Technology Co., Ltd., Tu-Cheng City, Taipei Hsien (TW)

( * ) Notice: Subject to any disclaimer, the term of this patent is extended or adjusted under 35 U.S.C. 154(b) by 183 days.

(21) Appl. No.: 11/137,014

(22) Filed: May 25, 2005

(65) Prior Publication Data

US 2006/0126303 A1    Jun. 15, 2006

(30) Foreign Application Priority Data

Dec. 11, 2004  (CN)  .................. 2004 2 0102732 U

(51) Int. Cl.
*H05K 7/20* (2006.01)

(52) U.S. Cl. ...................... 361/704; 361/709; 361/710; 165/80.3; 257/707

(58) Field of Classification Search ................ 361/690, 361/700–712, 714, 719; 165/80.3, 185; 257/706–727, 257/685, 795; 174/16.3; 29/512, 830, 832, 29/837

See application file for complete search history.

(56) References Cited

U.S. PATENT DOCUMENTS

| | | | |
|---|---|---|---|
| 6,386,274 B1 * | 5/2002 | Wang et al. | 165/80.3 |
| 6,452,803 B1 | 9/2002 | Liu | |
| 6,828,673 B2 * | 12/2004 | Ficorilli et al. | 257/707 |
| 7,123,483 B2 * | 10/2006 | Otsuki et al. | 361/710 |
| 7,142,422 B2 * | 11/2006 | Lee et al. | 361/695 |

* cited by examiner

*Primary Examiner*—Michael Datskovskiy
(74) *Attorney, Agent, or Firm*—Morris Manning & Martin LLP; Tim Tingkang Xia, Esq.

(57) ABSTRACT

A heat dissipating device includes a heat sink and a clip attached on the heat sink. The heat sink includes a solid trunk and a plurality of fins extending radially outwardly from a circumference of the trunk. A rectangular extension portion is formed at a bottom end of the trunk. A pressing portion extends from the extension portion and abuts against the clip toward the heat sink in an axial direction of the heat sink. The clip defines a rectangular opening fittingly receiving the extension portion to thereby form a positioning structure for preventing the clip from moving relative to the heat sink in a circumferential direction of the heat sink.

14 Claims, 5 Drawing Sheets

HEAT DISSIPATING DEVICE

CROSS-REFERENCE TO RELATED APPLICATION

This application is a copending application of U.S. patent application Ser. No. 11/015,984, entitled "HEAT DISSIPATING DEVICE AND METHOD FOR MANUFACTURING IT", filed on Dec. 17, 2004 and assigned to the same assignee. The disclosure of the above identified application is incorporated herein by reference.

TECHNICAL FIELD

The present invention relates to a heat dissipating device, and particularly to a heat dissipating device incorporating a heat sink and a clip secured on the heat sink.

BACKGROUND

As computer technology continues to advance, electronic components such as central processing units (CPUs), are made to provide faster operational speeds and greater functional capabilities. When a CPU operates at a high speed in a computer enclosure, its temperature frequently increases greatly. It is desirable to dissipate the heat generated by the CPU quickly. To solve this problem of heat generated by the CPU, a heat sink is often used to be mounted on top of the CPU to dissipate heat generated thereby.

To ensure the heat sink firmly contacting with the CPU, a clip is usually used for securing the heat sink to the CPU. A conventional clip is generally M-shaped and has a central pressing portion and a pair of locking legs extending downwardly from opposite ends of the pressing portion. In use, the clip extends transversely a heat sink which specially defines a channel for receiving the clip. The pressing portion of the clip is used to abut the heat sink toward the CPU to cause the heat sink to firmly contact the CPU. However, the special channel defined in the heat sink reduces the effective heat dissipating area of the heat sink thereby decreasing heat dissipating capibility of the heat sink. Therefore, a heretofore unaddressed need exists in the industry to address the aforementioned deficiencies and inadequacies.

SUMMARY

A heat dissipating device in accordance with a preferred embodiment of the present invention includes a heat sink and a clip attached on the heat sink. The heat sink includes a trunk and a plurality of fins extending radially outwardly from a circumference of the trunk. A rectangular extension portion is formed at a bottom end of the trunk which is used for contacting with a heat generating component. A pressing portion extends from the extension portion and abuts against the clip toward the heat sink in an axial direction of the heat sink. The clip defines a rectangular opening fittingly receiving the extension portion to thereby form a positioning structure for preventing the clip from moving relative to the heat sink in a circumferential direction of the heat sink.

Other objects, advantages and novel features of the present invention will be drawn from the following detailed description of a preferred embodiment of the present invention with attached drawings, in which:

DETAILED DESCRIPTION OF PREFERRED EMBODIMENTS

Figure 1:
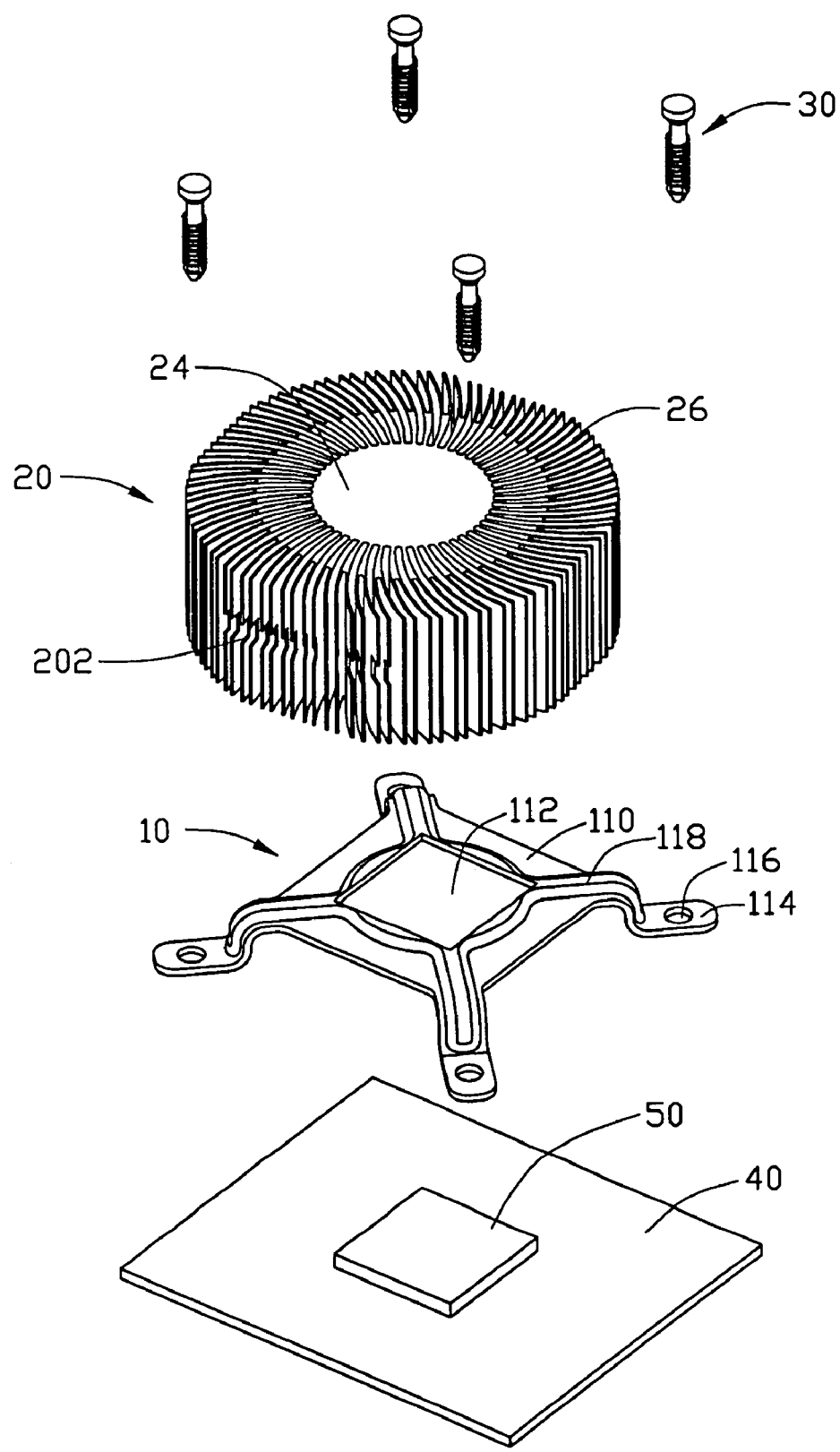
FIG. 1 is an exploded view of a heat dissipating device in accordance with a preferred embodiment of the present invention together with a circuit board on which a central processing unit is mounted.

FIG. 1 shows a heat dissipating device in accordance with a preferred embodiment of the present invention. The heat dissipating device comprises a clip 10 and a heat sink 20.

Figure 2:
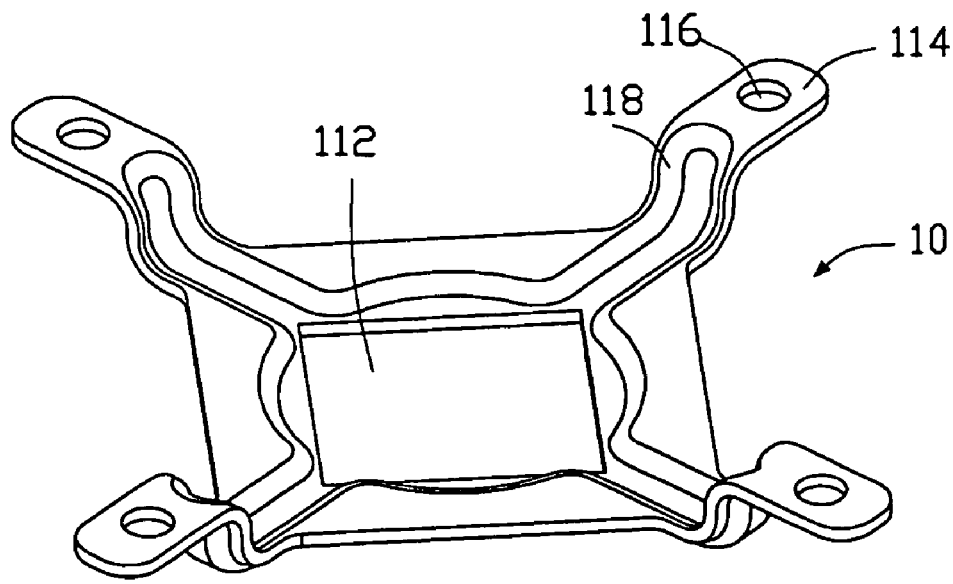
FIG. 2 shows an inverted and exploded view of the heat dissipating device of FIG. 1.
Figure 2:
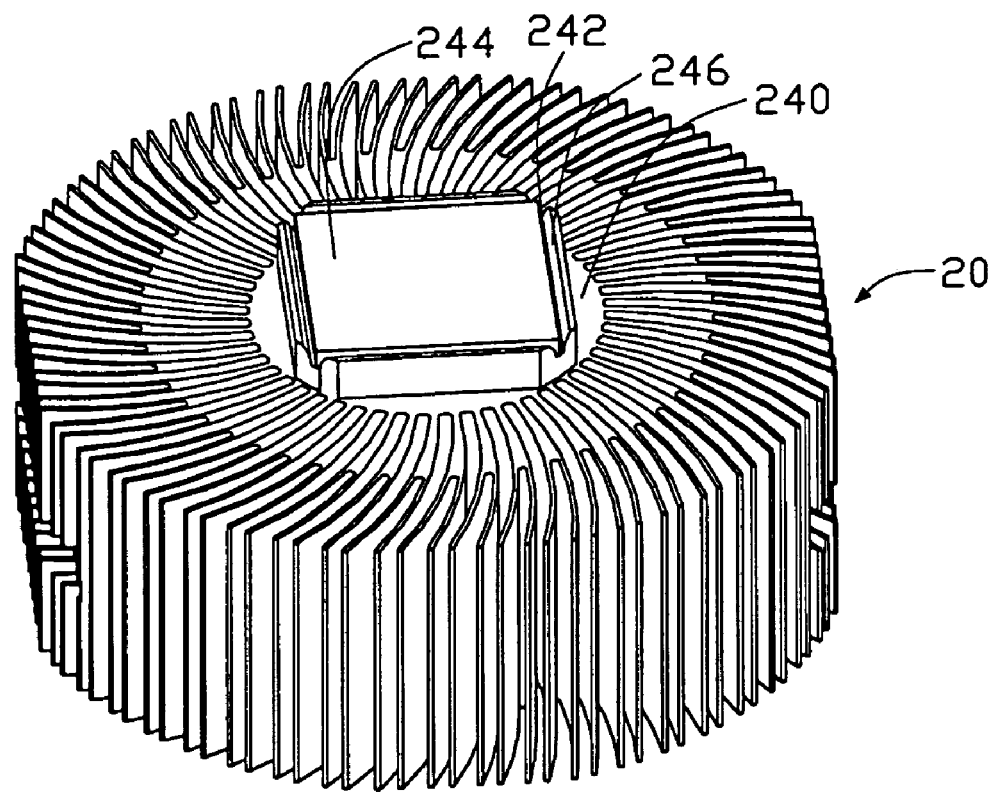

Referring also to FIG. 2, the clip 10 is one-piece member and comprises a rectangular body 110 and four arms 114 extending outwardly from four corners of the body 110 respectively. The body 110 defines a rectangular opening 112 therethrough. Each arm 114 compries a mounting section formed at a free end thereof. The mounting section defines a locking aperture 116 therein for extension of a locking pin 30 to engage with a circuit board 40 in a locking aperture (not shown) defined thereat. Each arm 114 forms a reinforcing rib 118 which extends from the body 110 adjacent the opening 112 to the mounting section.

The heat sink 20 comprises a solid column-shaped trunk 24 and a pluratiy of fins 26 radially and curvedly extending from an outer circumferential surface of the trunk 24. A pair of groups of cutouts 202 (only one group visible) is defined at the fins 26 for facilitating mounting of a fan (not shown) on the heat sink 20. Referring also to FIG. 2, a rectangular extension portion 244 integrally extends downwardly from a bottom end 240 of the trunk 24 in an axial direction of the heat sink 20. The extension portion 244 is used to contact with a heat generating component such as a central processing unit 50 (as shown in FIG. 1) mounted on the circuit board 40. An elongated groove 242 is defined at the extension portion 244 adjacent to each of four side edges thereof. Four collars 246 are therefore formed at four sides of the extension portion 244, adjacent to the grooves 242, respectively. The thickness of the collar 246 decreases gradually in a direction of from top to bottom and an arcuate surface is formed communicating with the groove 242.

Figure 3:
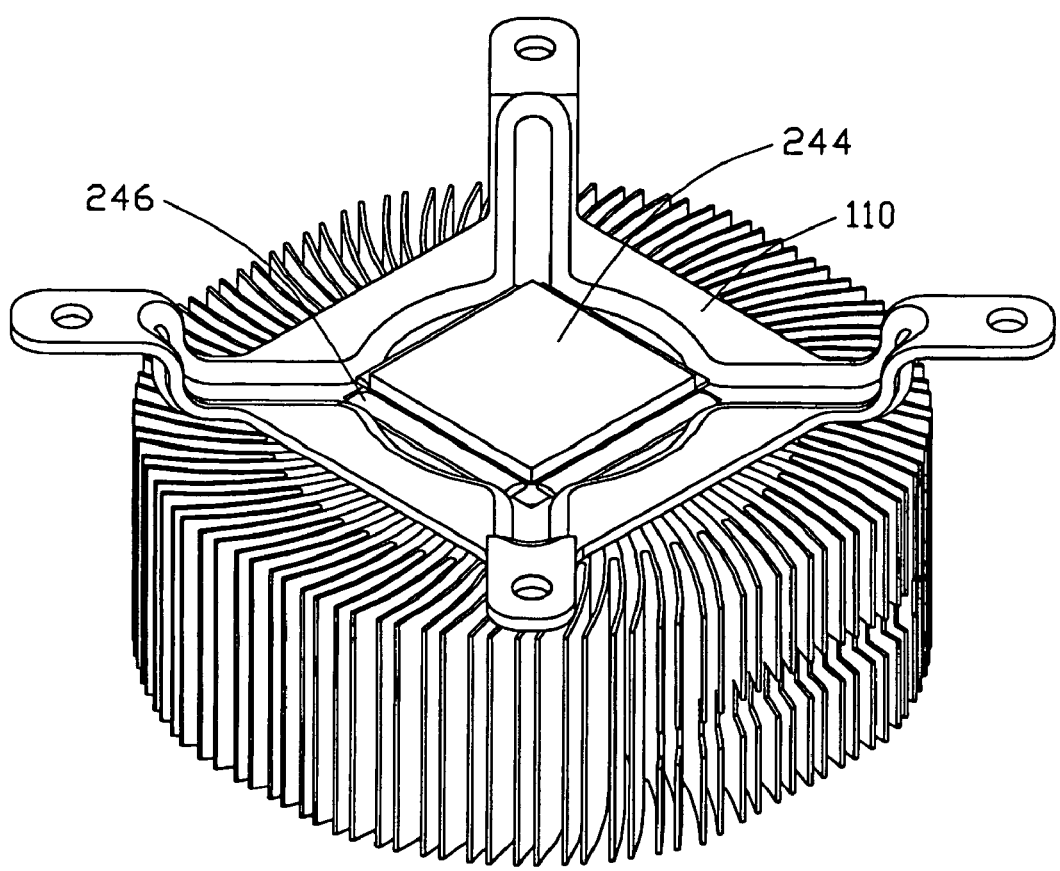
FIG. 3 is an assembled view of FIG. 2.
Figure 4:
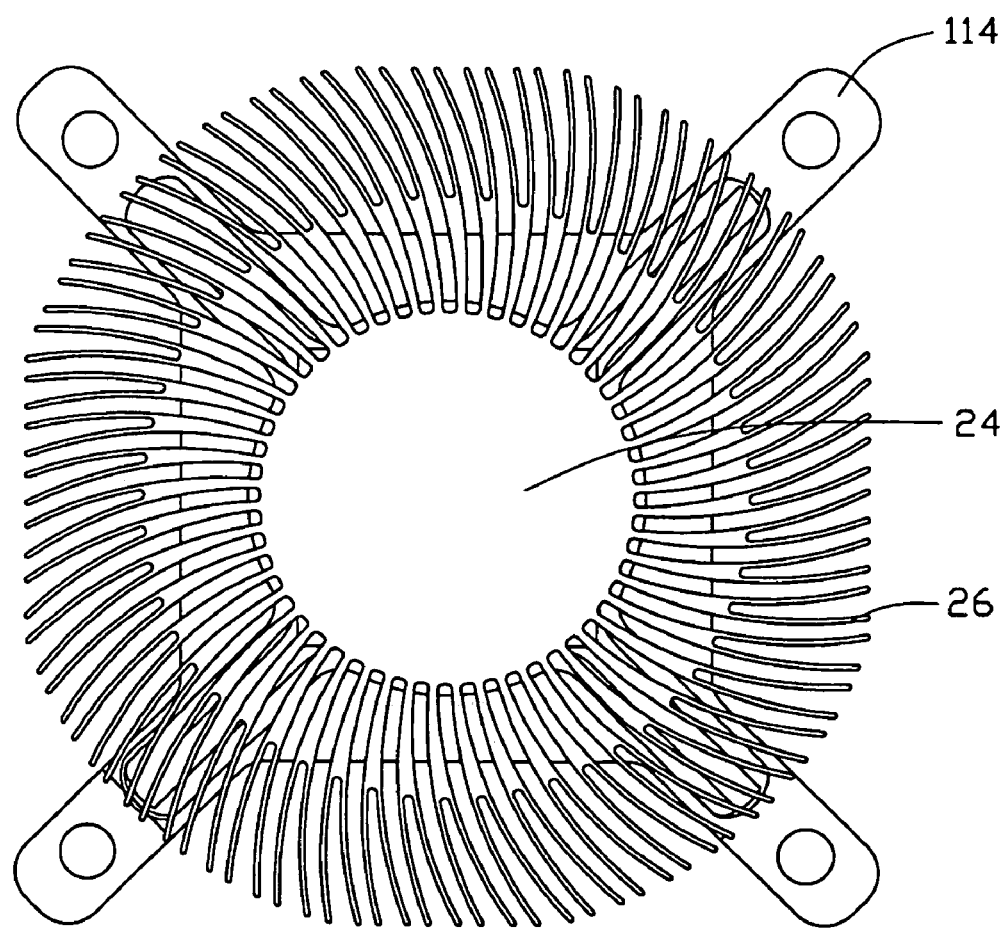
FIG. 4 is a top plan view of the assembled heat dissipating device.

Referring also to FIGS. 3-4, in assembly, the clip 10 is placed on the bottom end of the heat sink 20. The extension portion 244 of the heat sink 20 extends through the opening 112 of the clip 10. The collars 246 are then punched and therefore bent outwardly to form pressing portions pressed on four sides of the body 110 of the clip 10 neighboring the opening 112, respectively. Thus, the body 110 of the clip 10 is sandwiched between the pressing portions of the extension portion 244 of the trunk 24 and the bottom end of the heat sink 20. The clip 10 is therefore securely attached to the heat sink 20.

In the preferred embodiment of the present invention, the pressing portions of the heat sink 20 press the clip 10 toward the heat sink 20 to thereby position the clip 10 on the heat sink 20 in the axial direction of the heat sink 20. The extension portion 244 of the heat sink 20 and the opening 112 of the clip 10 both are rectangular-shape and the extension portion 244 is fittingly received in the opening 112 to thereby form a positioning structure for preventing the clip 10 from moving relative to the heat sink 20 in a circumferential direction of the heat sink 20. Understandably, the shape of the extension portion 244 and the opening 112 is not limited to rectangular and may be other shape with at least one straight edge, such as, polygon or triangular or semicircle. The positioning structure may also be formed by a protrusion extending from one of the clip 10 and the heat sink 20 to be received in a void defined in the other of the clip 10 and the heat sink 20. Perferrably, the grooves 242 and the collars 246 are formed before the clip 10 is placed on the heat sink 20. Alternatively, the grooves 242 and the collars 246 may be formed after the clip 10 is placed on the heat sink 20

Figure 5:
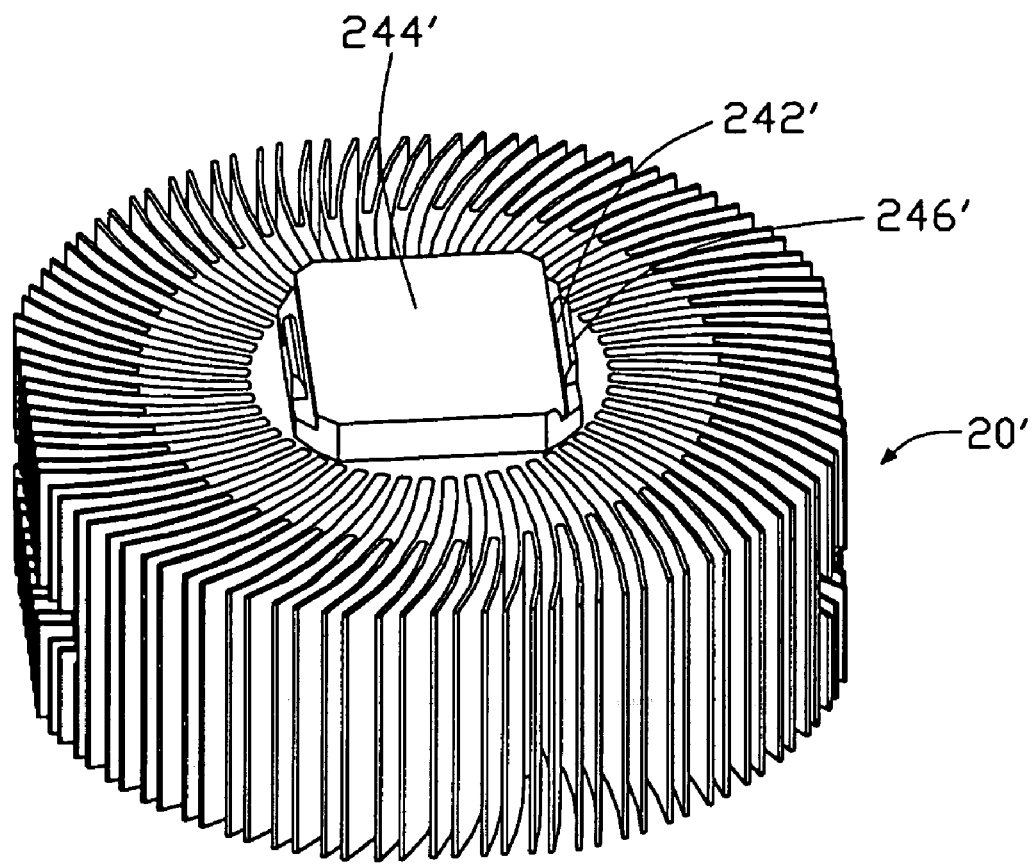
FIG. 5 shows a heat sink in accordance with an alternative embodiment of the present invention.

FIG. 5 shows a heat sink 20' in accordance with an alternative embodiment of the present invention. The heat sink 20' is similar to the heat sink 20 of the preferred embodiment described above except an extension portion 244' of the alternative embodiment. The extension portion 244' also has a rectangular configuration, but comprises only a pair of grooves 242' and collars 246' formed at opposite sides thereof. Four corners of the extension portion 244' are cut off, whereby facilitating the fitting of the extension portion 244' into the opening 112 of the body 110 of the clip 10. Each collar 246' is shorter than a corresponding side edge of the extension portion 244' from which the collar 246' extends. The operation for fastening the clip 10 to the heat sink 20' is similar to that for the first embodiment.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating device comprising:
   a heat sink having a solid trunk and a plurality of fins extending radially from a circumferential surface of the trunk;
   a one-piece clip attached to the heat sink, a pressing portion extending from the heat sink and abutting against the clip toward the heat sink in a first direction; and
   a positioning structure formed between the clip and the heat sink for preventing the clip from moving relative to the heat sink in a second direction perpendicular to the first direction;
   wherein the trunk comprises an extension portion extending from one end of the trunk, the pressing portion extends from a periphery of the extension portion, the clip defines a rectangular opening, and the extension portion has a rectangular shape and is fittingly received in the opening to thereby form said positioning structure.

2. The heat dissipating device as claimed in claim 1, wherein the extension portion defines a groove between the pressing portion and the extension portion.

3. The heat dissipating device as claimed in claim 2, wherein the pressing portion completely surrounds the extension portion.

4. The heat dissipating device as claimed in claim 2, wherein the pressing portion is formed at opposite sides of the extension portion.

5. A heat dissipating device comprising:
   a heat sink;
   a clip provided on the heat sink;
   a pressing portion extending from the heat sink and abutting against the clip toward the heat sink in a first direction; and
   a positioning structure formed between the clip and the heat sink for preventing the clip from moving relative to the heat sink in a second direction perpendicular to the first direction;
   wherein the heat sink comprises an extension portion formed at one end thereof, the extension portion has at least one straight side edge, and the clip defines an opening fittingly receiving the extension portion to thereby form said positioning structure; and
   wherein the extension portion has a rectangular configuration, and the opening has a shape corresponding to the extension portion.

6. The heat dissipating device as claimed in claim 5, wherein the pressing portion extends from a periphery of the extension portion and presses on the clip.

7. The heat dissipating device as claimed in claim 5, wherein the clip is one-piece member.

8. The heat dissipating device as claimed in claim 5, wherein the clip comprises a body on which the opening is defined and a plurality of arms extending from the body.

9. The heat dissipating device as claimed in claim 8, wherein each arm forms a reinforcing rib which extends from the body adjacent the opening.

10. A heat dissipating device comprising:
    a heat sink having a trunk, a plurality of the fins extending radially outwardly from an outer circumference of the trunk and an extension portion extending downwardly from a bottom of the heat sink, said extension portion has a profile of a polygon;
    a clip adapted for fastening the heat sink to a circuit board thereby to dissipate heat of an electronic device mounted on the circuit board, the clip defining a polygonal opening fittingly receiving the extension portion of the heat sink.

11. The heat dissipating device as claimed in claim 10, wherein the extension portion has a rectangular profile and the opening is a rectangular opening.

12. The heat dissipating device as claimed in claim 11, wherein the extension portion has four collars pressing against the clip.

13. The heat dissipating device as claimed in claim 11, wherein the extension has two collars pressing against the clip.

14. The heat dissipating device as claimed in claim 13, wherein four corners of the extension portion are cut off to facilitate the fitting of the extension portion in the opening.

* * * * *